United States Patent
Zarei

(10) Patent No.: US 8,243,855 B2
(45) Date of Patent: Aug. 14, 2012

(54) CALIBRATED QUADRATURE GENERATION FOR MULTI-GHZ RECEIVER

(75) Inventor: Hossein Zarei, Irvine, CA (US)

(73) Assignee: Freescale Semiconductor, Inc., Austin, TX (US)

(*) Notice: Subject to any disclaimer, the term of this patent is extended or adjusted under 35 U.S.C. 154(b) by 1130 days.

(21) Appl. No.: 12/118,108

(22) Filed: May 9, 2008

(65) Prior Publication Data

US 2009/0279642 A1 Nov. 12, 2009

(51) Int. Cl.
*H04L 27/22* (2006.01)
(52) U.S. Cl. ............ 375/327; 327/156; 327/255
(58) Field of Classification Search .......... 375/327; 327/156, 255
See application file for complete search history.

(56) References Cited

U.S. PATENT DOCUMENTS

| | | | |
|---|---|---|---|
| 6,137,995 A | 10/2000 | Durec et al. | |
| 6,144,846 A | 11/2000 | Durec | |
| 6,265,917 B1 | 7/2001 | Main et al. | |
| 6,591,093 B1 | 7/2003 | Coffing et al. | |
| 2005/0231367 A1* | 10/2005 | Bellantoni | 340/572.1 |
| 2006/0290444 A1 | 12/2006 | Chen | |
| 2009/0174486 A1* | 7/2009 | Haralabidis et al. | 331/45 |
| 2011/0025328 A1* | 2/2011 | Elliott et al. | 324/316 |

OTHER PUBLICATIONS

Chung-Yu Wu et al., A 5-GHz CMOS Double-Quadrature Receiver Front-End with Single-Stage Quadrature Generator, IEEE Journal of Solid-State Circuits, vol. 39, No. 3, Mar. 2004.
Andrea Mazzanti et al., Analysis and Design of Injection-Locked LC Dividers for Quadrature Generation, IEEE Journal of Solid-State Circuits, vol. 39, No. 9, Sep. 2004.
David Lovelace et al., A Self Calibrating Quadrature Generator with Wide Frequency Range, IEEE Radio Frequency Integrated Circuits Symposium, 1997.
S. Reynolds et al., 60GHz Transceiver Circuits in SiGe Bipolar Technology, 2004 IEEE International Solid-State Circuits Conference, Feb. 2004.

* cited by examiner

*Primary Examiner* — Shuwang Liu
*Assistant Examiner* — Michael Neff
(74) *Attorney, Agent, or Firm* — Hamilton & Terrile, LLP; Michael Rocco Cannatti

(57) ABSTRACT

An integrated receiver circuit includes a phase locked loop circuit (21) with a voltage controlled oscillator (VCO) (25) and a quadrature generator circuit (29) which uses hybrid-branch line coupler circuits (27, 28) coupled to buffered VCO outputs, where the hybrid-branch line coupler circuits (27, 28) are tuned by same control voltage (25a) that controls the VCO (25). By replicating the VCO core circuitry in each hybrid-branch line coupler circuit (27, 28) under common control of a control voltage, calibrated quadrature signals are generated that have the same frequency as the phase locked loop circuit (21).

20 Claims, 3 Drawing Sheets

CALIBRATED QUADRATURE GENERATION FOR MULTI-GHZ RECEIVER

BACKGROUND OF THE INVENTION

1. Field of the Invention

The present invention is directed in general to the field of integrated circuits. In one aspect, the present invention relates to a circuit and method of generating quadrature signals from a high-frequency input signal.

2. Description of the Related Art

Transceiver circuits are used in a myriad of wireless communication applications, such as cordless telephones, pagers, cellular telephones, and global positioning systems. With such transceiver circuits, quadrature modulation techniques are used which enable two independent signals to be combined at a transmitter, transmitted on the same transmission band, and separated at a receiver. The principle of quadrature modulation is that two separate signals, I and Q (In-phase and Quadrature phase), are modulated by using the same carrier wave frequency, but the carrier wave of signal Q is ninety degrees out of phase with the carrier wave of signal I. As a result, the quadrature modulated signals can be summed before transmission to the receiver. Because of the phase difference, the receiver can separate the summed I and Q signals from each other. In particular, the receiver typically receives a high-frequency input modulation signal from an antenna in a heterodyne system, and then downconverts the input signal to a much lower frequency using a mixer and a local oscillator signal. Once the incoming modulation signal is frequency shifted, the modulated data is recovered in the lower frequency signal. To convert the input high-frequency signal in a direct-conversion transceiver to a baseband frequency so that information in the input signal can be detected, quadrature signals are needed to apply to the mixer. Typically, quadrature signals are created by using divide-by-2 circuits, poly-phase filter or quadrature oscillator, but such solutions can increase the power consumption and required chip area, or otherwise require an oscillator that having a frequency that is twice the desired frequency. While self-calibrating quadrature generators have been proposed which use a delay locked loop (DLL) to produce quadrature outputs, these generators are used to generate quadrature signals in relatively low frequency (e.g., <1 GHz) receivers. With higher frequency receivers (e.g., >10 GHz), it becomes more difficult to generate accurate quadrature signals because of variations in the process, voltage and/or temperature.

Accordingly, a need exists for an integrated transceiver circuit that generates accurate quadrature signals that may be applied to an image-reject mixer to convert the input high-frequency signal in direct-conversion transceiver to a baseband frequency signal. There is also a need for an improved receiver circuit to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

A multi-GHz receiver circuit is described which generates quadrature mixer local oscillator (LO) signals from a phase locked loop (PLL) output signal using a calibrated quadrature generator that includes hybrid coupler circuits controlled or tuned by a shared voltage controlled oscillator (VCO) in the PLL circuit. By including circuitry that replicates the VCO core circuitry, each hybrid coupler creates calibrated accurate quadrature LO signals with the same frequency as the VCO to operate. With this approach, the calibrated quadrature generator may be used with a multi-GHz (e.g., over 20 GHz) receiver without requiring that the VCO operate at a multiple of the desired frequency. In an example embodiment where the VCO is implemented as an inductor and variable capacitor coupled in parallel, each hybrid coupler includes two replicas of the VCO core with same inductor and varactor. In addition, each hybrid coupler includes cross-coupled transistors which are provided to reduce coupler loss and to match the parasitic capacitance at the coupler terminals to the VCO output. The operation of the receiver circuit allows accurate quadrature mixer LO signals to be generated from a shared multi-GHz frequency VCO over process-voltage-temperature variations with a minimal increase in power consumption and circuit size, and without requiring a frequency divider to divide down a VCO that is a multiple of the receiver's operation frequency.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. Such descriptions and representations are used by those skilled in the art to describe and convey the substance of their work to others skilled in the art.

Figure 1:
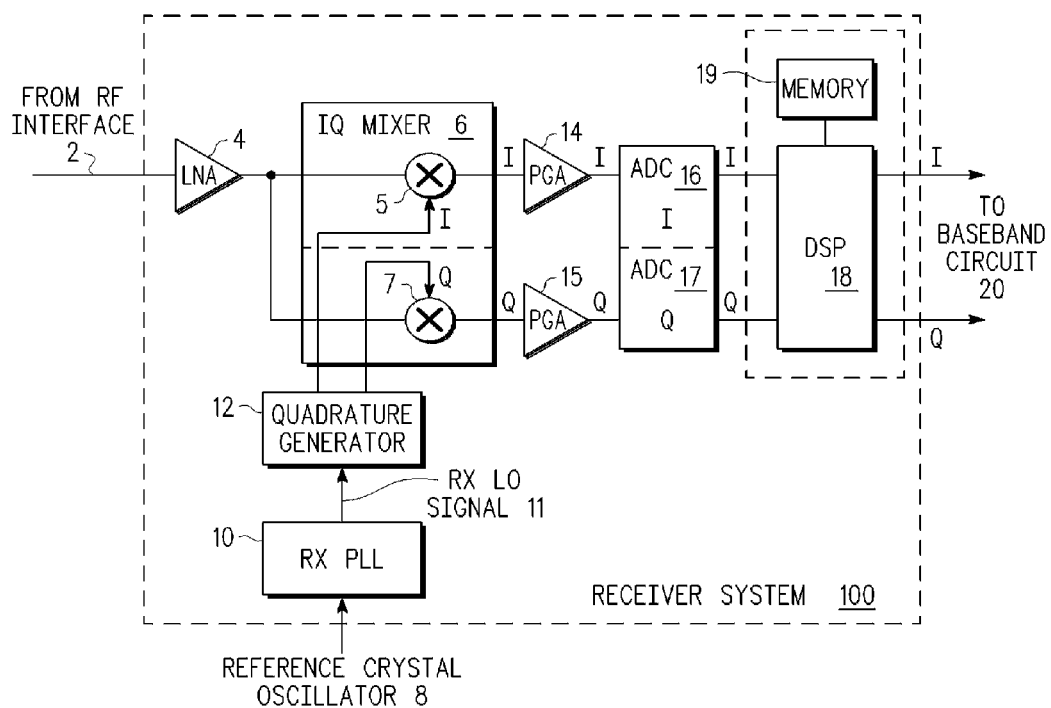
FIG. 1 depicts a simplified block diagram of a receiver system in which selected embodiments of the present invention may be implemented.

Turning now to FIG. 1, there is shown a simplified block diagram of a receiver system 100 in which selected embodiments of the present invention may be implemented. The depicted receiver system 100 may be implemented as a wireless communication device (e.g., a cellular telephone handset or a wireless data modem) which receives an incoming radio frequency (RF) signal 2 from an RF interface (not shown). In operation, the receiver system 100 is configured to down-convert the frequency of the received RF signal 2 and to provide the down-converted signal to a baseband circuit 20 (not shown) for demodulation and decoding of the signal. Though not shown, it will be appreciated that the receiver system 100 may be a subsystem of a transceiver system which includes a transmitter subsystem for receiving a modulated baseband signal from a baseband circuit and providing a modulated radio frequency (RF) output signal to the RF interface.

In the illustrated embodiment, the receiver system 100 amplifies the incoming radio frequency (RF) signal with a low noise amplifier (LNA) 4, which in turn is coupled to an in-phase/quadrature (IQ) mixer 6. In addition, a reference signal 8 (e.g., from a crystal oscillator) provided to the receiver system 100 is processed by a receiver phase locked loop (RX PLL) circuit 10 to provide a receiver local oscillator (RX LO) signal 11 to a quadrature generator 12, which is in turn coupled to provide quadrature LO signals to the IQ mixer 6. The in-phase (I) and quadrature (Q) outputs of IQ mixer 6 are coupled to programmable gain amplifiers (PGAs) 14, 15, respectively, which in turn are coupled to analog-to-digital converters (ADC) 16, 17. The ADC circuits 16, 17 generate digital versions of the in-phase (I) and quadrature (Q) outputs from the IQ mixer 6 that are provided to a digital signal processor (DSP) 18 which may perform additional signal processing under control of program code stored in the memory 19.

In operation, the receiver local oscillator (RX LO) signal 11 output from RX PLL 10 is generated at a selected frequency to tune the receiver system 100 to a desired channel. The RX LO signal 11 is phase locked to a reference signal 8. An incoming modulated RF signal 2 received by the RF interface is amplified by LNA 4. The amplified RF signal is applied to both the I and Q portions of IQ mixer 6. The quadrature LO signals I, Q generated by quadrature generator 12 are 90 degrees out of phase, and are mixed with the incoming RF signal by the IQ mixer circuits 5, 7 to produce a modulated I and Q signal pair at an IF frequency. The modulated I and Q signal pair is amplified by PGAs 14, 15 and input into the ADC circuits 16, 17, respectively. Each ADC circuit 16, 17 may be implemented with a delta-sigma converter that is configured to convert the I and Q signals into respective I and Q bit streams which are input into DSP 18 for processing.

Figure 2:
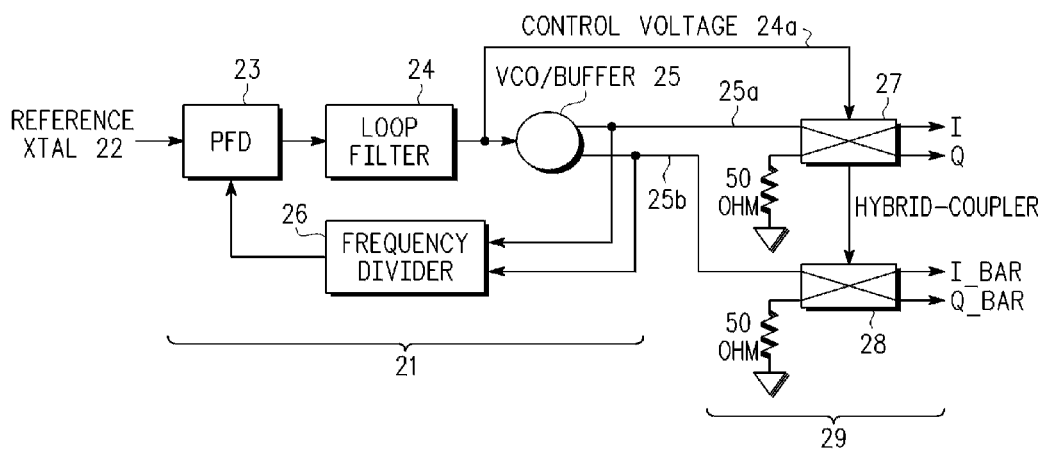
FIG. 2 is a block diagram of a calibrated quadrature generator in accordance with selected embodiments of the present invention.

FIG. 2 is a block diagram of receiver circuitry for generating quadrature LO signals using a PLL circuit 21 and a calibrated quadrature generator 29 in accordance with selected embodiments of the present invention. The depicted PLL circuit 21 receives a reference signal 22 (e.g., from a reference oscillator) at a phase detector 23. The phase detector 23 compares the phase and frequency of the reference signal 22 to a feedback signal provided at an output of a programmable frequency divider circuit 26, and generates an output signal corresponding to the phase difference between the input signals. The output signal of phase detector 23 is provided to a low pass or loop filter (LPF) 24. The LPF 24 filters the output signal and generates an analog control voltage 24a to control the frequency of the VCO/buffer 25. As shown in FIG. 2, the control voltage 24a is also connected to tune the hybrid-coupler circuits 27, 28 (described below). The depicted VCO/buffer 25 provides two differential outputs 25a, 25b that are phase shifted by 180 degrees from one another. The first VCO output 25a is coupled to control a first hybrid coupler circuit 27, while the second VCO output 25b is coupled to control a second hybrid coupler circuit 28. VCO outputs 25a and 25b are also providing a feedback signal to a second input of phase detector 23 via the frequency divider circuit 26 which reduces the frequency of the feedback signals 25a, 25b by N, where N is the divide value of a frequency divider 26. In accordance with this feedback arrangement, the VCO outputs 25a, 25b generated by the PLL circuit 21 are phase locked with the reference signal 22, and are used to control the hybrid-90 degree branch-line coupler circuits 27, 28. In accordance with selected embodiments of the present invention, each hybrid coupler circuit 27, 28 includes two replicas of the core circuitry from the VCO 25, thereby providing a calibrated quadrature generator 29 which accurately generates calibrated quadrature signals I, Q, I_Bar, Q_Bar having the same frequency as the VCO 25, where I and I_bar are phase shifted by 180 degrees from one another, and Q and Q_bar are phase shifted by 180 degrees from one another.

Figure 3:
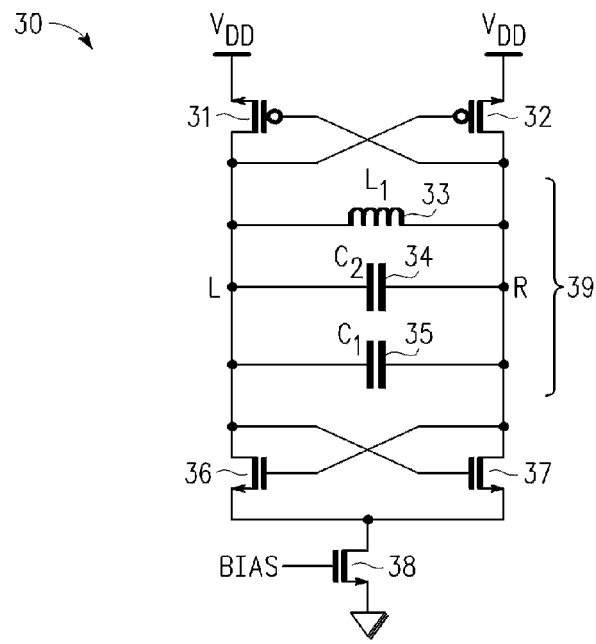
FIG. 3 is a circuit schematic of an example voltage controlled oscillator circuit.

To provide an example of how the VCO core circuitry may be replicated in the calibrated quadrature generator, reference is now made to FIG. 3 which depicts a circuit schematic of an example differential one-inductor voltage controlled oscillator circuit 30. As depicted, the VCO 30 is connected to a power supply $V_{DD}$ through two cross-coupled PMOS transistors 31, 32 and is connected to ground through the NMOS transistor 38 which is biased to form an NMOS current mirror. In the VCO 30, the NMOS transistors 36, 37 form a lower layer of the gain providing structure, while the PMOS transistors 31, 32 form an upper layer of the gain providing structure. In addition, a parallel resonance LC tank circuit 39 is connected between the lower layer and the upper layer, and includes an inductor $L_1$ 33, a constant capacitor $C_1$ 35, and a variable capacitor $C_2$ 34 which forms a varactor component. With this configuration, the LC tank circuit 39 oscillates at $$\omega_0 = \frac{1}{\sqrt{L_1 \times (C_1 + C_2)}},$$

where the oscillation frequency is controlled by the variable capacitor $C_2$ 34. For example, the values of the inductor and capacitor components in the LC tank circuit 39 may be chosen so that the VCO 30 has a frequency at or above 10-15 GHz. The differential output from the VCO 30 can be taken from the single-ended left-output L and right-output R. While the VCO 30 depicted in FIG. 3 is implemented with NMOS technology, it will be appreciated that PMOS technology may instead by used to construct all or part of the VCO.

When included as part of the PLL circuitry for generating quadrature LO signals (such as shown in FIG. 2), the VCO 30 is connected to the hybrid coupler circuits 27, 28 through a common-source buffer 48 (shown in FIG. 4) having an inductive load (which can be equal to $L_1$) for buffering the sinusoidal output of the VCO 30. Thus, a common-source buffer has a differential inputs connected to the VCO 30 differential outputs (left-output L and right-output R) which are 180 degree out of phase with each other. One of the differential outputs of common-source buffer is connected to the input terminal 41 of the hybrid coupler circuit 27 and the other output of common-source buffer is connected to input terminal of $2^{nd}$-hybrid coupler (not shown in FIG. 4). In addition, the differential outputs from the common-source buffer are connected in feedback as differential inputs to the frequency divider circuit 26. As will be appreciated, the VCO 30 may be implemented with PMOS technology by using a PMOS bias transistor (not shown) connected between the PMOS transistors 31, 32 and the power supply $V_{DD}$, thereby eliminating the NMOS transistor 38.

Figure 4:
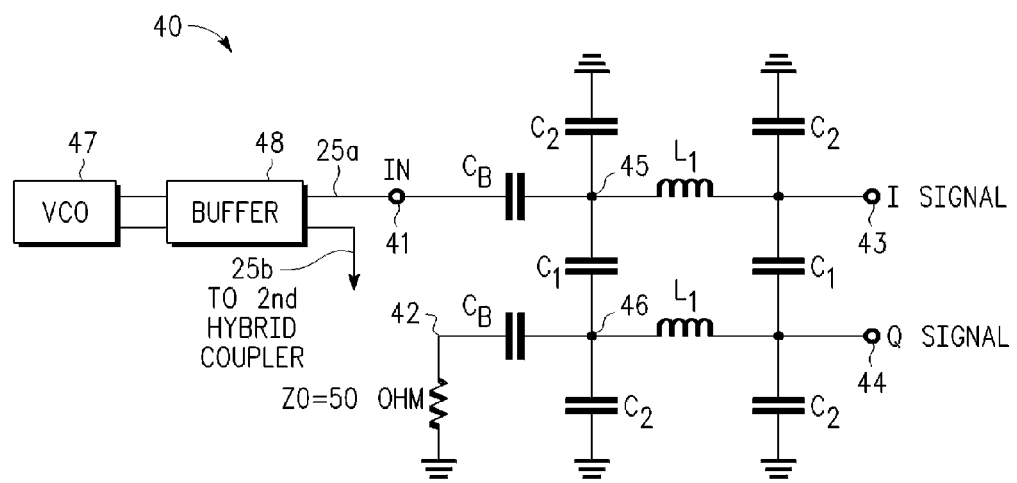
FIG. 4 is a circuit schematic of a basic hybrid branch-line coupler circuit that may be used in a calibrated quadrature generator.

With the example VCO core circuitry 30 shown in FIG. 3, each hybrid coupler circuit 27, 28 may be implemented as a lumped element component that includes a replica of the VCO core circuitry for generating calibrated quadrature LO signals. For example, FIG. 4 depicts a circuit schematic of a basic hybrid branch-line coupler circuit 40 that may be used in a calibrated quadrature generator. The depicted hybrid branch-line coupler circuit 40 includes first and second inductors $L_1$ (each having the same inductance value as the VCO inductor $L_1$ 33), first and second constant capacitors $C_1$ (each having the same capacitance value as the VCO capacitor $C_1$ 35), and four variable capacitors $C_2$ (each having the same capacitance value as the VCO capacitor $C_2$ 34). As shown in FIG. 4, the hybrid branch-line coupler circuit 40 has four terminals 41-44 and two internal nodes 45, 46. A first input terminal 41 is connected to receive one of the differential VCO outputs 25a from the VCO 47 through a common source buffer 48. A second terminal 42 is connected to terminate at a resistor Z0 having a resistance which matches the characteristic impedance for the hybrid coupler 40 (e.g., 50 ohm). Finally, the third and fourth terminals 43, 44 provide the outputs from the hybrid coupler 40, where the third terminal 43 generates a signal (I Signal) having the same phase as the VCO output, and the fourth terminal 44 generates a quadrature signal (Q Signal) which is 90 degrees out of phase with the VCO output.

As shown in FIG. 4, the other buffered differential VCO output 25b from the VCO 47 is provided to the other hybrid coupler circuit (not shown in FIG. 4). In addition, the buffered VCO output 25a (at the first terminal 41) is provided to a first internal node 45 via a first buffering capacitor $C_B$. The first internal node 45 is connected to ground through a first variable capacitor $C_2$, is connected to the third terminal 43 through a first inductor $L_1$, and is connected to a second internal node 46 through a first constant capacitor $C_1$. In addition, the second internal node 46 is connected to ground through a second variable capacitor $C_2$, is connected to the second terminal 42 through a second buffering capacitor $C_B$, and is connected to the fourth terminal 44 through a second inductor $L_1$. Finally, the third and fourth terminals 43, 44 are each connected to ground through third and fourth variable capacitors $C_2$, respectively, and are connected to one another through a shared constant capacitor $C_1$. With this configuration, the VCO and hybrid coupler are calibrated when the inductors $L_1$ all have substantially the same inductance value, the constant capacitors $C_1$ all have substantially the same capacitance value, and the variable capacitors $C_2$ all have substantially the same capacitance value that is controlled by the control voltage.

To create calibrated quadrature signals at the hybrid coupler circuit output terminals 43, 44 with same frequency as the VCO circuit 30, the values of the inductor $L_1$, the constant capacitor $C_1$, and the variable capacitor $C_2$ are chosen using the following equations $$C_1 = \frac{1}{\omega_0 \cdot Z_0}, L_1 = \frac{Z_0}{\omega_0 \cdot \sqrt{2}}, \text{ and } C_2 = \frac{1}{\omega_0^2 \cdot L_1} - C_1.$$

Figure 5:
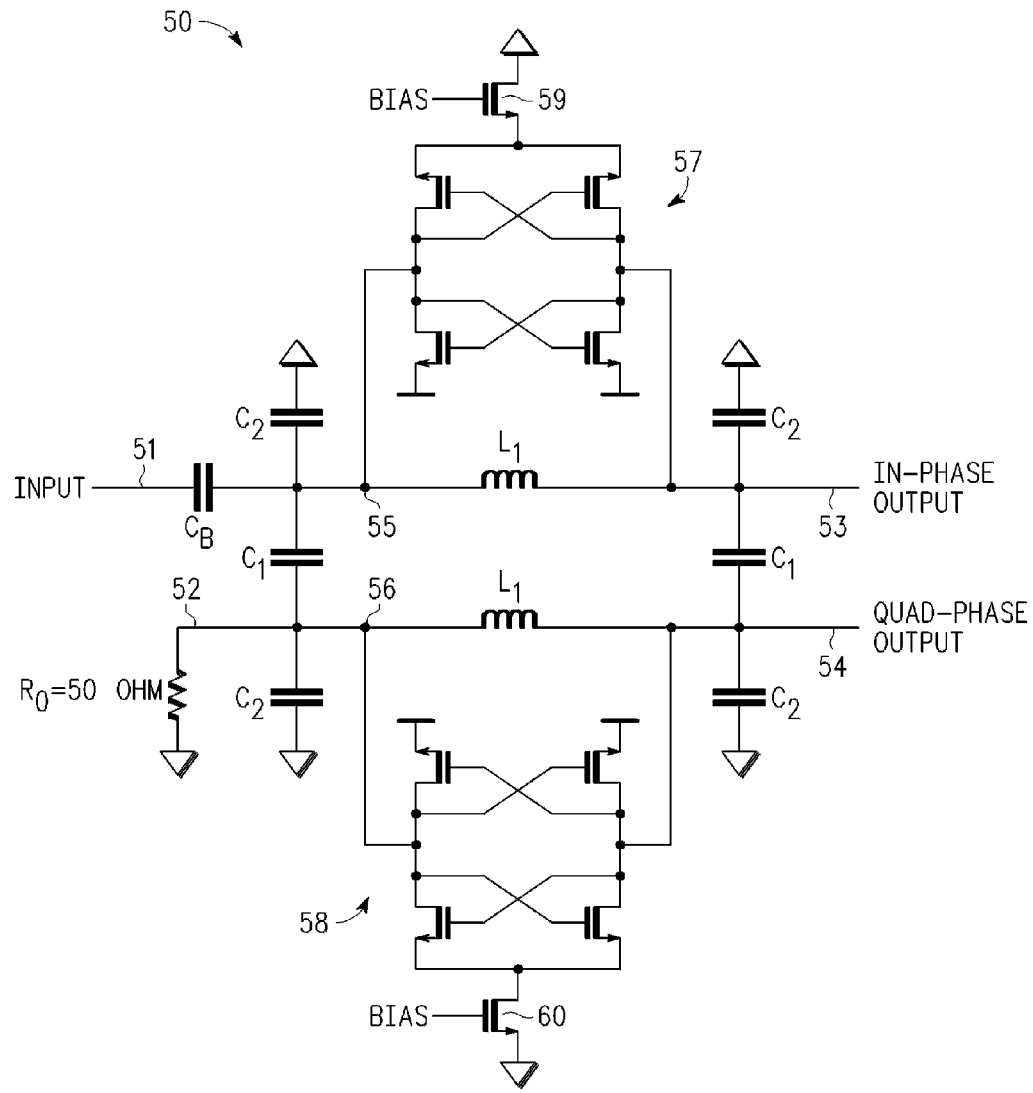
FIG. 5 is a circuit schematic of an impedance matched hybrid branch-line coupler circuit that may be used to create calibrated and accurate quadrature signals with same frequency as VCO in a calibrated quadrature generator.

Though not shown, the impedance at the four terminals 41-44 of the hybrid coupler 40 may be matched by adding an extra load of Z0 (e.g., 50 ohm) to the output of buffer 48 parallel to its own inductive load. In this way, the impedance looking from every terminal 41-44 of the hybrid coupler 40 will be equal to Z0. In addition, the parasitic capacitance at the four terminals 41-44 of the hybrid coupler circuit may be matched to the outputs of the VCO 47 by adding two cross-coupled transistors to the hybrid coupler circuit. An example of such a hybrid coupler circuit is shown in FIG. 5 which depicts a circuit schematic of an impedance matched hybrid branch-line coupler circuit 50 that may be used to create calibrated accurate quadrature signals with same frequency as VCO. The depicted hybrid branch-line coupler circuit 50 includes first and second inductors $L_1$ (each having the same inductance value as the VCO inductor $L_1$), first and second constant capacitors $C_1$ (each having the same capacitance value as the VCO capacitor $C_1$), and four variable capacitors $C_2$ (each having the same capacitance value as the VCO capacitor $C_2$), all of which are connected as shown in FIG. 5 to the four terminals 51-54 and two internal nodes 55, 56. To match the parasitic capacitance at the coupler terminals, the hybrid branch-line coupler circuit 50 also includes a first bias transistor 59 and two cross-coupled transistor pairs 57 coupled across the first inductor $L_1$, as well as a second bias transistor 60 and two cross-coupled transistor pairs 58 coupled across the second inductor $L_1$. Each of the cross-coupled transistor pairs 57, 58 have the same size and configuration as the cross-coupled transistors in the VCO. However, because these cross-coupled transistors have a much smaller tail current than tail current of the VCO core, they will act as two negative resistances, thereby effectively increasing the quality factor for the first and second inductors $L_1$ in the coupler circuit 50 and decreasing the signal loss of this passive coupler circuit 50.

Referring back to FIG. 2, each of the hybrid coupler circuits 27, 28 may be implemented with the hybrid branch-line coupler circuit 50 so that the VCO 25 in the PLL circuit 21 that generates the desired frequency will also control the hybrid coupler circuits 27, 28 which each include circuitry replicating the core circuitry of the VCO 25. With this arrangement, calibrated quadrature signals are accurately generated by the hybrid branch-line coupler circuits 50 to have the same frequency as the VCO 25, and with very small added power consumption. The disclosed arrangement is well suited for high frequency receivers (e.g., where the operation frequency is more than 10 GHz) which use quadrature LO signals to convert high-frequency input signals to much lower frequency baseband signal, especially where it is not practical with such receivers to use a VCO that operates at two or four times the receiver's operation frequency.

By now it should be appreciated that there has been provided a method and apparatus for generating calibrated quadrature signals in a multi-GHz receiver system. The disclosed receiver circuit and methodology use a PLL circuit and a quadrature generator circuit. The PLL circuit is coupled to receive a reference signal, and includes a VCO circuit that is controlled by a control voltage to generate first and second PLL output signals. In selected embodiments, the PLL circuit includes a phase detector having a first input coupled to receive a reference signal, a low pass filter coupled to an output of the phase detector for generating the control voltage, a differential single-inductor VCO coupled to an output of the low pass filter for generating first and second PLL output signals under control of the control voltage, and a frequency dividing circuit having an input coupled to the second PLL output signal and an output coupled in feedback to a second input of the phase detector. For example, the differential single-inductor VCO may be implemented as a parallel resonance LC tank circuit in which a first inductor L1, a constant capacitor C1, and a variable capacitor C2 are connected in parallel between first and second output nodes. The differential single-inductor VCO may also be include a first pair of cross-coupled transistors coupled between a first predetermined reference voltage and the first and second output nodes, and a second pair of cross-coupled transistors coupled between a biasing transistor and the first and second output nodes. As for the quadrature generator circuit, it may be implemented with first and second hybrid branch line coupler circuits. The first hybrid branch line coupler circuit may be coupled to receive the first PLL output signal, while the second hybrid branch line coupler circuit is coupled to receive the second PLL output signal. By controlling both hybrid branch line coupler circuits with the VCO control voltage, each hybrid branch line coupler circuit generates first and second center frequency signals separated in phase from each other by substantially ninety degrees. In a selected embodiment, each hybrid branch line coupler circuit includes two replicas of the VCO core circuit. For example, a hybrid branch line coupler circuit may include four nodes ($1^{st}$ node, $2^{nd}$ node, $3^{rd}$ node, and $4^{th}$ node), each of which is coupled to a reference voltage through a variable capacitor. In the example configuration of the hybrid branch line coupler circuit, a first branch or inductive element L2 is coupled between the first and second nodes, and a second branch or inductive element L3 is coupled between the third and fourth nodes. In addition, a third branch element is coupled as a first constant capacitor between the first and third nodes, and a fourth branch element is coupled as a second constant capacitor between the second and fourth nodes. Finally, a third pair of cross-coupled transistors is coupled between a first predetermined reference voltage and the first and second nodes, while a fourth pair of cross-coupled transistors is coupled between a biasing transistor and the first and second nodes. In this configuration, the first inductor L1, second inductive element L2, and third inductive element L3 each have substantially the same inductance value. In addition, the constant capacitor C1, first constant capacitor, and second constant capacitor each have substantially the same capacitance value. Finally, the variable capacitor C2 and each of the variable capacitors have substantially the same capacitance value that is controlled by the control voltage.

In another form, there is provided a method and circuit for generating quadrature local oscillator signals. With the disclosed circuitry and methodology, an analog control signal and first and second differential output signals are generated from a phase lock loop circuit comprising a VCO core circuit. For example, the analog control signal may be generated from an input reference clock signal with the phase lock loop circuit, while the first and second differential output signals are generated with the VCO core circuit under control of the analog control voltage and then connected in feedback (e.g., through a frequency divider) to the phase lock loop circuit. For example, the analog control signal may be generated with the phase lock loop circuit by receiving and comparing an input reference clock signal with a feedback signal provided by a frequency divider coupled to receive the first and second differential output signals, thereby generating an output signal corresponding to a phase difference between the input reference clock signal and the feedback signal, which is then filtered to generate the analog control voltage. The generated first and second differential output signals are phase locked with the input reference clock signal, and are applied to first and second hybrid branch line coupler circuits, respectively, to generate calibrated quadrature local oscillator signals. As disclosed, each of the first and second hybrid branch line coupler circuits includes circuitry that replicates the VCO core circuit. For example, the VCO core circuit and each of the hybrid branch line coupler circuits may include an inductor, a variable capacitor, and a pair of cross-coupled transistors coupled in parallel. In addition, each of the first and second hybrid branch line coupler circuits is controlled by the analog control voltage to generate first and second local oscillator signals separated in phase from each other by substantially ninety degrees. With this arrangement, the analog control signal is applied in common to control the VCO core circuit, the first hybrid branch line circuit, and the second hybrid branch line circuit, where the first hybrid branch line circuit is coupled to receive a first differential output signal from the phase lock loop circuit, and where the second hybrid branch line circuit is coupled to receive a second differential output signal from the phase lock loop circuit.

In yet another form, there is provided a calibrated quadrature generator circuit and methodology which uses a phase lock loop circuit and a pair of hybrid branch line coupler circuits. The phase lock loop circuit is coupled to receive a reference signal, and includes a VCO core circuit that is controlled by a control voltage to generate first and second differential output signals. A first hybrid branch line coupler circuit includes a replica of the VCO core circuit that is coupled to receive the first differential output signal, and that is controlled by the control voltage to generate first and second local oscillator signals separated in phase from each other by substantially ninety degrees. In addition, a second hybrid branch line coupler circuit includes another replica of the VCO core circuit that is coupled to receive the second differential output signal and that is controlled by the control voltage to generate third and forth local oscillator signals separated in phase from each other by substantially ninety degrees. In selected embodiments, the VCO core circuit includes an inductor and a variable capacitor coupled in parallel, while in other embodiments, the VCO core circuit includes an inductor, a variable capacitor and a pair of cross coupled transistors coupled in parallel. In either case, the variable capacitor may be implemented with two variable capacitors coupled in series to a common node (e.g., ground).

Although the described exemplary embodiments disclosed herein are directed to various systems and methods for generating calibrated quadrature local oscillator (LO) signals from a phase locked loop (PLL) output signal, the present invention is not necessarily limited to the example embodiments which illustrate inventive aspects of the present invention. For example, different VCO circuit designs may be used than that depicted in FIG. 3. In similar fashion, different coupler circuits may be used for the calibrated quadrature generator, including but not limited to single-box branch-line coupler circuits, double-box branch-line coupler circuits, transmission-line branch-line coupler circuits, lumped-element branch-line coupler circuits, unequal-split branch-line coupler circuits, Lange coupler circuits, etc. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A receiver circuit, comprising:
   a phase lock loop (PLL) circuit coupled to receive a reference signal, said phase lock loop circuit comprising a voltage controlled oscillator circuit that is controlled by a control voltage to generate a first PLL output signal and a second PLL output signal; and
   a quadrature generator circuit comprising:
   a first hybrid branch line coupler circuit that is coupled to receive the first PLL output signal and that is controlled by the control voltage to generate first and second local oscillator signals separated in phase from each other by substantially ninety degrees, and
   a second hybrid branch line coupler circuit that is coupled to receive the second PLL output signal and that is controlled by the control voltage to generate third and fourth local oscillator signals separated in phase from each other by substantially ninety degrees.

2. The receiver circuit of claim 1, where the phase lock loop circuit comprises:
   a phase detector having a first input coupled to receive the reference signal;
   a low pass filter coupled to an output of the phase detector for generating the control voltage;
   a differential single-inductor voltage controlled oscillator coupled to an output of the low pass filter for generating the first PLL output signal and the second PLL output signal under control of the control voltage; and
   a frequency dividing circuit having an input coupled to the second PLL output signal of the differential single-inductor voltage controlled oscillator and an output coupled to a second input of the phase detector.

3. The receiver circuit of claim 2 where the differential single-inductor voltage controlled oscillator comprises a parallel resonance LC tank circuit in which a first inductor $L_1$, a constant capacitor $C_1$, and a variable capacitor $C_2$ are connected in parallel.

4. The receiver circuit of claim 3, where the first hybrid branch line coupler circuit comprises:
   a first node coupled to a reference voltage through a first variable capacitor;
   a second node coupled to the reference voltage through a second variable capacitor;
   a third node coupled to the reference voltage through a third variable capacitor;
   a fourth node coupled to the reference voltage through a fourth variable capacitor;
   a first branch comprising a second inductor $L_2$ coupled between the first and second nodes;
   a second branch comprising a third inductor $L_3$ coupled between the third and fourth nodes;
   a third branch comprising a first constant capacitor coupled between the first and third nodes; and
   a fourth branch comprising a second constant capacitor coupled between the second and fourth nodes;
   where the first inductor $L_1$, second inductor $L_2$, and third inductor $L_3$ each have substantially the same inductance value; where the constant capacitor $C_1$, first constant capacitor, and second constant capacitor each have substantially the same capacitance value; and where the variable capacitor $C_2$, first variable capacitor, second variable capacitor, third variable capacitor and fourth variable capacitor each have substantially the same capacitance value that is controlled by the control voltage.

5. The receiver circuit of claim 4, where the second hybrid branch line coupler circuit comprises:
   a fifth node coupled to the reference voltage through a fifth variable capacitor;
   a sixth node coupled to the reference voltage through a sixth variable capacitor;
   a seventh node coupled to the reference voltage through a seventh variable capacitor;
   an eighth node coupled to the reference voltage through an eighth variable capacitor;
   a fifth branch comprising a fourth inductor $L_4$ coupled between the fifth and sixth;
   a sixth branch comprising a fifth inductor $L_5$ coupled between the seventh and eighth nodes;
   a seventh branch comprising a third constant capacitor coupled between the fifth and seventh nodes; and
   an eighth branch comprising a fourth constant capacitor coupled between the sixth and eighth nodes;
   where the first inductor $L_1$, fourth inductor $L_4$, and fifth inductor $L_5$ each have substantially the same inductance value; where the constant capacitor $C_1$, third constant capacitor, and fourth constant capacitor each have substantially the same capacitance value; and where the variable capacitor $C_2$, fifth variable capacitor, sixth variable capacitor, seventh variable capacitor and eighth variable capacitor each have substantially the same capacitance value that is controlled by the control voltage.

6. The receiver circuit of claim 2 where the differential single-inductor voltage controlled oscillator comprises:
   a parallel resonance LC tank circuit in which a first inductor $L_1$, a constant capacitor $C_1$, and a variable capacitor $C_2$ are connected in parallel between first and second output nodes;
   a first pair of cross-coupled transistors coupled between a first predetermined reference voltage and the first and second output nodes; and
   a second pair of cross-coupled transistors coupled between a biasing transistor and the first and second output nodes.

7. The receiver circuit of claim 6, where the first hybrid branch line coupler circuit comprises:
   a first node coupled to a reference voltage through a first variable capacitor;
   a second node coupled to the reference voltage through a second variable capacitor;
   a third node coupled to the reference voltage through a third variable capacitor;
   a fourth node coupled to the reference voltage through a fourth variable capacitor;
   a first branch comprising a second inductor $L_2$ coupled between the first and second nodes;
   a second branch comprising a third inductor $L_3$ coupled between the third and fourth nodes;
   a third branch comprising a first constant capacitor coupled between the first and third nodes;
   a fourth branch comprising a second constant capacitor coupled between the second and fourth nodes;
   a third pair of cross-coupled transistors coupled between a first predetermined reference voltage and the first and second nodes; and
   a fourth pair of cross-coupled transistors coupled between a biasing transistor and the first and second nodes;

where the first inductor $L_1$, second inductor $L_2$, and third inductor $L_3$ each have substantially the same inductance value; where the constant capacitor $C_1$, first constant capacitor, and second constant capacitor each have substantially the same capacitance value; and where the variable capacitor $C_2$, first variable capacitor, second variable capacitor, third variable capacitor and fourth variable capacitor each have substantially the same capacitance value that is controlled by the control voltage.

8. The receiver circuit of claim 7, where the second hybrid branch line coupler circuit comprises:
   a fifth node coupled to the reference voltage through a fifth variable capacitor;
   a sixth node coupled to the reference voltage through a sixth variable capacitor;
   a seventh node coupled to the reference voltage through a seventh variable capacitor;
   an eighth node coupled to the reference voltage through an eighth variable capacitor;
   a fifth branch comprising a fourth inductor $L_4$ coupled between the fifth and sixth;
   a sixth branch comprising a fifth inductor $L_5$ coupled between the seventh and eighth nodes;
   a seventh branch comprising a third constant capacitor coupled between the fifth and seventh nodes;
   an eighth branch comprising a fourth constant capacitor coupled between the sixth and eighth nodes;
   a third pair of cross-coupled transistors coupled between a first predetermined reference voltage and the third and fourth nodes; and
   a fourth pair of cross-coupled transistors coupled between a biasing transistor and the third and fourth nodes;
   where the first inductor $L_1$, fourth inductor $L_4$, and fifth inductor $L_5$ each have substantially the same inductance value; where the constant capacitor $C_1$, third constant capacitor, and fourth constant capacitor each have substantially the same capacitance value; and where the variable capacitor $C_2$, fifth variable capacitor, sixth variable capacitor, seventh variable capacitor and eighth variable capacitor each have substantially the same capacitance value that is controlled by the control voltage.

9. A method for generating quadrature local oscillator signals, comprising:
   generating an analog control signal and first and second differential output signals from a phase lock loop circuit comprising a voltage controlled oscillator (VCO) core circuit;
   applying the first and second differential output signals to first and second hybrid branch line coupler circuits, respectively, to generate calibrated quadrature local oscillator signals, where each of the first and second hybrid branch line coupler circuits comprises circuitry that replicates the VCO core circuit, and where each of the first and second hybrid branch line coupler circuits is controlled by the analog control signal to generate first and second local oscillator signals separated in phase from each other by substantially ninety degrees.

10. The method of claim 9, further comprising applying the analog control signal to control the VCO core circuit, the first hybrid branch line coupler circuit, and the second hybrid branch line circuit, where the first hybrid branch line circuit is coupled to receive a first differential output signal from the phase lock loop circuit, and where the second hybrid branch line circuit is coupled to receive a second differential output signal from the phase lock loop circuit.

11. The method of claim 9, where generating the analog control signal and the first and second differential output signals from a phase lock loop circuit comprises:
   generating the analog control signal from an input reference clock signal with the phase lock loop circuit;
   generating first and second differential output signals with the VCO core circuit under control of the analog control signal;
   connecting the first and second differential output signals in feedback to the phase lock loop circuit.

12. The method of claim 11, where generating the analog control signal comprises:
   receiving the input reference clock signal;
   comparing the input reference clock signal with a feedback signal provided by a frequency divider coupled to receive the first and second differential output signals, thereby generating an output signal corresponding to a phase difference between the input reference clock signal and the feedback signal; and
   generating the analog control signal by filtering the output signal.

13. The method of claim 11, where connecting the first and second differential output signals in feedback to the phase lock loop circuit comprises dividing the frequency of the first and second differential output signals.

14. The method of claim 11, where generating first and second differential phase locked output signals comprises generating first and second differential phase locked output signals that are phase locked with the input reference clock signal.

15. The method of claim 9, where applying the first and second differential output signals to first and second hybrid branch line coupler circuits comprises:
   applying the first differential output signal to the first hybrid branch line coupler circuit that is controlled by the analog control signal to generate first and second local oscillator signals separated in phase from each other by substantially ninety degrees; and
   applying the second differential output signal to the second hybrid branch line coupler circuit that is controlled by the analog control signal to generate third and fourth local oscillator signals separated in phase from each other by substantially ninety degrees.

16. The method of claim 9, where applying the first and second differential output signals to first and second hybrid branch line coupler circuits comprises:
   applying the first and second differential output signals to first and second hybrid branch line coupler circuits, respectively, to generate calibrated quadrature local oscillator signals, where each of the first and second hybrid branch line coupler circuits comprises an inductor, a variable capacitor, and a pair of cross-coupled transistors coupled in parallel.

17. A calibrated quadrature generator circuit, comprising:
   a phase lock loop circuit coupled to receive a reference signal, said phase lock loop circuit comprising a voltage controlled oscillator core circuit that is controlled by a control voltage to generate first and second differential output signals;
   a first hybrid branch line coupler circuit comprising a first replica of the voltage controlled oscillator core circuit that is coupled to receive the first differential output signal and that is controlled by the control voltage to generate first and second local oscillator signals separated in phase from each other by substantially ninety degrees, and a second hybrid branch line coupler circuit comprising a second replica of the voltage controlled oscillator core circuit that is coupled to receive the second differential output signal and that is controlled by the control voltage to generate third and fourth local oscillator signals separated in phase from each other by substantially ninety degrees.

18. The calibrated quadrature generator circuit of claim 17, where the voltage controlled oscillator core circuit comprises an inductor and a variable capacitor coupled in parallel.

19. The calibrated quadrature generator circuit of claim 17, where the voltage controlled oscillator core circuit comprises an inductor, a variable capacitor, and a pair of cross-coupled transistors coupled in parallel.

20. The calibrated quadrature generator circuit of claim 18, where the variable capacitor comprises two variable capacitors coupled in series to a common node.

* * * * *